(12) United States Patent
Igarashi

(10) Patent No.: US 6,911,363 B2
(45) Date of Patent: Jun. 28, 2005

(54) SEMICONDUCTOR DEVICE AND MANUFACTURING METHOD THEREOF

(75) Inventor: Yasushi Igarashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 181 days.

(21) Appl. No.: 10/414,721

(22) Filed: Apr. 16, 2003

(65) Prior Publication Data

US 2003/0222301 A1 Dec. 4, 2003

Related U.S. Application Data

(63) Continuation of application No. 10/154,824, filed on May 28, 2002, now Pat. No. 6,573,587.

(51) Int. Cl.⁷ .......................................... H01L 21/8242
(52) U.S. Cl. ........................ 438/244; 438/239; 438/957
(58) Field of Search ............................... 438/239, 244, 438/957

(56) References Cited

U.S. PATENT DOCUMENTS

| 6,124,164 | A | * | 9/2000 | Al-Shareef et al. | ......... 438/240 |
| 6,174,766 | B1 | | 1/2001 | Hayashi et al. | ............. 438/241 |
| 6,426,250 | B1 | * | 7/2002 | Lee et al. | .................... 438/239 |
| 6,573,587 | B1 | * | 6/2003 | Igarashi | ...................... 257/532 |
| 6,828,189 | B2 | * | 12/2004 | Igarashi | ...................... 438/239 |
| 2001/0034069 | A1 | * | 10/2001 | Nakura et al. | ................. 438/3 |

* cited by examiner

Primary Examiner—Alexander Ghyka
(74) Attorney, Agent, or Firm—Volentine Francos & Whitt, PLLC

(57) ABSTRACT

A semiconductor device of the present invention includes capacitors made up of a lower electrode, a capacitive insulation film made from metal oxide material, provided on one surface of a semiconductor substrate. An ozone TEOS film is provided on these capacitors, and a protective film for covering the upper surfaces of the capacitors is then provided on this ozone TEOS film. An interlay insulation film that is thicker than the ozone TEOS film is provided on the protective film for covering the upper surfaces of the capacitors. In this way, the present invention prevents degradation in film quality of the capacitive insulation film due to mutual reaction etc. As a result, it becomes possible to provide a capacitor using an insulating film made of a metal oxide as a capacitive insulation film, having a protective film for sufficiently preventing diffusion of $H_2$, a semiconductor device having high reliability, and a method of manufacturing such a semiconductor device, are provided.

23 Claims, 6 Drawing Sheets

SEMICONDUCTOR DEVICE AND MANUFACTURING METHOD THEREOF

CROSS-REFERENCE TO RELATED APPLICATIONS

The present application is a continuation application under 37 C.F.R.§1.53(b) and claims priority under 35 U.S.C. §120 from U.S. patent application Ser. No. 10/154,824 filed May 28, 2002, now U.S. Pat. No. 6,573,587. The disclosure of this application is specifically incorporated by reference herein.

BACK GROUND OF THE INVENTION

The present invention relates to a semiconductor device and manufacturing method thereof, and particularly to effective technology applied to a semiconductor device having capacitive elements using an insulating film made from metallic oxide as a capacitive insulation film and a manufacturing method thereof.

In the related art, DRAMs (Dynamic random access memory) provided with transistors and capacitors are a typical example of a semiconductor storage device.

Capacitors constituting a DRAM are made of an upper electrode and a lower electrode, and a capacitive insulation film provided between these two electrodes. An insulation film made from a silicon compound such as a silicon oxide film or a nitride film is generally used as this capacitive insulation film Also at the present time, the use of high dielectric film or ferroelectric films, having smaller surface area but large capacitance compared to conventional capacitive insulation film made of silicon oxide or silicon nitride, as a capacitive film of a capacitor is being investigated.

Of these films, a capacitor having a ferroelectric film as a capacitive insulation film is used in the formation of semiconductor storage devices known as FeRAM (Ferroelectric random access memory).

FeRAM are non-volatile semiconductor storage devices capable of obtaining the same read speed and write speed as for a conventional DRAM. For this reason they are being noted as future semiconductor memory devices.

Insulating film made from metallic compounds, such as bismuth strontium titanate ($SrBi_2Ta_2O_9$) called SBT or zirconium lead titanate called PZT, are used in capacitive insulating films of capacitors constituting a FeRAM. Also, precious metal such as platinum (Pt) is used in upper electrodes and lower electrodes constituting the capacitors. This is exposed to a high temperature oxidizing atmosphere at the time of forming the high strength dielectric film or at the time of membrane improvement of the capacitive insulation film after forming the capacitors, and therefore requires oxidation resistance for the electrode material.

Conventionally, a semiconductor storage device using this type of high strength dielectric film is formed by forming active elements on a semiconductor substrate, and then sequentially forming capacitors having a high strength dielectric film and wiring layers for electrical interconnection, through an interlayer insulation film.

However, with a strong dielectric film made from a metal oxide material included in a semiconductor storage device, such as FeRAM, the formation energy of the oxide material is low compared to a dielectric film formed from a silicon compound included in a conventional semiconductor storage device, and has the property that reduction is easy. Because of this, with formation of a plug for electrically connecting between an inter-layer insulation film and each wiring layer after formation of a capacitor, or a step of exposing a capacitor having a strong dielectric film, for preventing damage to semiconductor elements added in each process etc., to a reducing atmosphere, it is easy for the strong dielectric film to be reduced by hydrogen ($H_2$) or moisture ($H_2O$) contained in the reducing atmosphere. As a result, there are critical problems like deterioration in the film quality of the strong dielectric film, and also degradation to the electrical characteristics of the capacitor.

In a semiconductor storage device including a high strength dielectric film of the related art, a capacitor is used with a protective film for preventing diffusion of $H_2O$ from the reducing atmosphere formed on the surface.

SUMMARY OF THE INVENTION

The object of the present invention is to provide a more highly reliable semiconductor device, and a method of manufacturing such as device, in which a capacitor using an insulating film made of a metal oxide as a capacitive insulation film has a protective film for sufficiently preventing diffusion of $H_2$, and film quality degradation of the capacitive insulation film due to mutual reaction is prevented.

With a capacitor having the protective film of the related art, mutual reaction inside the reducing atmosphere of a step of a manufacturing process after formation of the capacitor is caused by combining materials of a protective film for preventing diffusion of $H_2$ to a capacitive insulation film made from a metal oxide insulation film, an upper electrode and a lower electrode, and this causes degradation in the film quality of the capacitive insulation film. As a result, with a capacitor having a conventional protective film, there is a problem that it is not possible to obtain sufficient electrical characteristics of the capacitor.

With the present invention, in order to achieve the above described object, a semiconductor device according to one aspect of the present invention comprises a substrate, a lower electrode provided on a surface of this substrate, a capacitive insulation film formed from a metal oxide material formed on this lower electrode, capacitive elements including an upper electrode formed on the capacitive insulation film, a first silicon oxide film covering upper surfaces of the capacitive elements ands formed using a gas containing ozone, a protective film covering over the first silicon oxide film corresponding to upper surfaces of the capacitive elements, and an insulating film arranged on the protective film and having a film thickness thicker than the first silicon oxide film.

Also, in order to solve the problems described above, a semiconductor device according to another aspect of the present invention comprises a substrate, a lower electrode provided on a surface of this substrate, a lower electrode, a capacitive insulation film formed from a metal oxide material formed on this lower electrode, capacitive elements including an upper electrode formed on the capacitive insulation film, and a protective film, for covering upper surfaces of the capacitive elements, having a core element for at least crystallization of the capacitive insulation film, and formed from a metal oxide material having a compositional ratio of a core element for crystallization lower than the compositional ratio of a core element for crystallization included in the capacitive insulation film.

In addition, a method of manufacturing a semiconductor device according to one aspect of the present invention comprises the steps of forming capacitive elements, including a lower electrode, a capacitive insulating film formed from a metal oxide material formed on the lower electrode, and an upper electrode formed on the capacitive insulation film, on the surface of a substrate, a step of forming a first silicon oxide film by a chemical vapor phase deposition method using a gas containing ozone, a step of subjecting the first silicon oxide film to heat treatment after formation of the first silicon oxide film, a step of forming a protective film on the first silicon oxide film subjected to heat treatment and covering upper surfaces of the capacitive elements, and a step of forming an insulating film having a film thickness thicker than the first silicon oxide film on the protective film.

Also, in order to solve the problems described above, a method of manufacturing a semiconductor device according to another aspect of the present invention comprises a step of forming capacitive elements by sequential deposition on a surface of a substrate of a lower electrode, a capacitive insulation film formed from a metal oxide material, and an upper electrode, and a step of forming a protective film, on an upper surface of the substrate including the capacitive elements, having a core element for at least crystallization of capacitive insulation film, and formed from a metal oxide material having a compositional ratio of a core element for at least crystallization lower than the compositional ratio of a core element for at least crystallization included in the capacitive insulation film.

According to the present invention having these structures, it is possible to prevent mutual reaction between the protective film and the capacitor material, and as a result it is possible to provide a semiconductor that does not suffer from degradation of capacitor characteristics.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENT

A first embodiment of the present invention will be described in the following with reference to the drawings.

Figure 1:
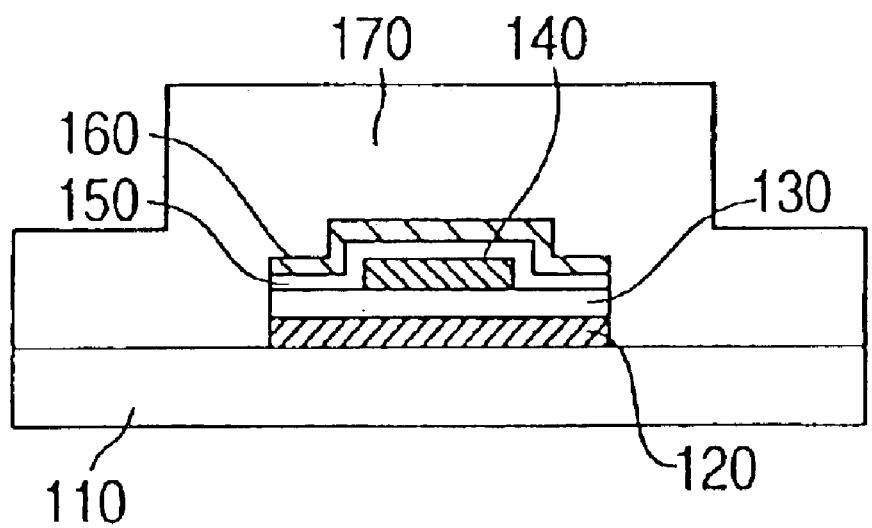
FIG. 1 is a cross sectional drawing showing a semiconductor device of a first embodiment of the present invention.

FIG. 1 and FIG. 2 are drawings showing a first embodiment of the present invention, FIG. 1 being a cross sectional drawing showing a semiconductor device of the first embodiment, and FIGS. 2(a)–(f) being cross sectional drawings showing respective processes of a manufacturing method for the semiconductor device of this embodiment.

First of all, a description will be given of the structure of a semiconductor device of this embodiment, using FIG. 1.

As shown in FIG. 1, a lower electrode 120, a capacitive insulation film 130 and an upper electrode 140 are sequentially deposited on a semiconductor substrate 110 made up of memory cell transistors and peripheral transistors, being semiconductor elements constituting, for example, a semiconductor storage device.

With the capacitor of the semiconductor of this embodiment, the upper electrode 140 constituting the capacitor is made smaller than the capacitive insulation film 130 and the lower electrode formed underneath, and is arranged so as to be positioned at a central section separated from the circumferential edge defined by the capacitive insulation film 130 and the lower electrode 120.

On upper surfaces of the upper electrode 140 and the capacitive insulating film 130 there is ozone ($O_3$) or an organic silicon compound, formed by a chemical vapor phase deposition method (hereinafter referred to as plasma in an ozone atmosphere CVD) using gas containing ozone ($O_3$) or an organic silicon compound, and a silicon oxide film 150 (hereafter referred to as ozone TEOS) having, for example, Tetra-Ethyl-Ortho-Silicate:TEOS as a main source material is film formed to a thickness of about 10 nm.

Here, the reason that an ozone TEOS film formed using a gas containing ozone is used as the silicon oxide film provided on the upper surface of the capacitor is that it is easy to receive the effects of $H_2$ in an $O_3$ atmosphere that has strong oxidizing power, making it possible to form the silicon oxide film to be provided on the upper surface of the capacitor.

With film formation of the silicon oxide film in an atmosphere having strong oxidation power like this, even if $H_2O$ contained within a chemical reactor is decomposed to $H_2$ within the plasma, it will become $H_2O$ again due to re-oxidation. As a result, it can be considered that the amount of $H_2O$ contained inside the chemical reactor will not increase.

Because of this, compared to a silicon oxide film formed by normal plasma CVD and not under an atmosphere having strong oxidation power, it can be considered that the probability of $H_2$ diffusing into the silicon oxide film formed using plasma CVD under an ozone atmosphere is small.

Specifically, the fact that there is a lot of $H_2O$ contained in the ozone TEOS film of the silicon oxide film formed by plasma CVD under an ozone atmosphere means that a film that contains substantially no $H_2$ to degrade the film quality of the capacitive insulation film is formed. In this way, it is possible to significantly reduce the danger of $H_2$ being generated at the time of heat treatment later in the manufacturing process.

Also, there is a protective film 160 for preventing diffusion of $H_2$ into the capacitor on the ozone TEOS film 150, which is, for example, Tantalum Oxide ($Ta_2O_5$) film formed to a thickness of around 50 nm so as to cover the surface of the capacitor including the ozone TEOS film 150.

An interlayer insulation film 170 of silicon oxide for electrically insulating between upper wiring layers is then formed to a thickness of around 300 nm on the protective film 170.

With this embodiment, a precious metal such as platinum is used as the lower electrode and upper electrode constituting the capacitor, and strontium bismuth titanate (SBT), being one type of insulating film made of a metal oxide material, is used in the capacitive insulation film 130. The ozone TEOS film 150 is then formed on the upper surface of the capacitor, that is, on the upper surface of the capacitive insulation film made of metal oxide material and the upper electrode, so as to extend, and the protective film 160 for preventing diffusion of $H_2$ is formed on that ozone TEOS film 150. Specifically, there is a structure providing an ozone TEOS film 150 where there is chemical stability between the capacitor material and the protective film for preventing diffusion of $H_2$, and it is difficult for a chemical reaction to occur between the respective materials.

With this embodiment, this type of structure means that there is no direct contact between the protective film and the capacitor material, and as a result it possible to prevent mutual reaction between the protective film and the capacitor material. Also, as conditions for selecting the material of the protective film 160, since there is no longer any need to take in to consideration the reactivity of the upper electrode 140 and the capacitive insulation film 130, it becomes possible to suitably select a material having excellent ability to act as a barrier against $H_2$ diffusion. Specifically, with this embodiment, there is no degradation in the film quality of the capacitive insulation film due to mutual reaction or $H_2$ generated in the manufacturing process, and as a result it is possible to provide a capacitor that maintains sufficient electrical characteristics.

Here, the ozone TEOS film 150 provided on the upper surface of the capacitor is formed sufficiently thinner than the inter layer insulation film 170 required to electrically insulate wiring layers formed on the upper part of the film 150. In this way, by thinly forming the ozone TEOS film 150 between the capacitor material and the protective film, it is possible to shorten the distance between the capacitor and the protective film. As a result, since the capacitor and the protective film become close to each other, it becomes possible to more effectively control diffusion of $H_2$ into the capacitor. More specifically, for an interlayer insulation film of about 300 nm, the effects of the present invention can be obtained by providing an ozone TEOS film of about 10 nm or more.

Further, generally a lot of $H_2O$ is contained inside the silicon oxide film formed by plasma CVD under an ozone atmosphere. Because of this, it is preferable to use an ozone TEOS film that has had $H_2O$ removed as much as possible from inside the film by heat treatment at 700° C. as the silicon oxide film.

In addition, with the semiconductor device of this embodiment, it is possible to further provide an insulating film that is finer than the ozone TEOS film 150, and that contains substantially no $H_2O$, such as a silicon oxide film, for example, formed by normal plasma chemical vapor phase deposition (hereafter referred to as plasma CVD) between the ozone TEOS film 150 and the protective film 160, and to use this lamination film as a film for controlling mutual reactivity between the capacitor and the protective film. Here, the fine insulating film is an insulating film having higher density than the density possessed by the ozone TEOS film 150. In this type of situation, since the film provided between the capacitor and the protective film is a lamination film comprised of the ozone TEOS film and the fine insulation film, it is possible to make a capacitor with better workability.

For similar reasons, the silicon oxide film of the interlayer insulation film 180 can also be formed either from a single film comprising an ozone TEOS film or a silicon oxide film formed by plasma CVD, or a lamination film comprising an ozone TEOS film and a silicon oxide film formed by plasma CVD.

However, as the fine insulating film, if a silicon oxide film formed by plasma CVD is used, $H_2$ becomes contained inside the film of the plasma CVD silicon oxide film, and there is a danger of $H_2$ being generated in subsequent heat treatment processes. This means that care must be taken with the temperature in the subsequent heat treatment processes.

With the first embodiment, the upper electrode 140 is arranged so as to be positioned in a central section separated from an edge defined by the capacitive insulation film 130 and the lower electrode 120, and the protective film 160 is provided so as to cover only the upper surface of the capacitor. By providing this structure, film degradation due to $H_2$ diffusion of the capacitive insulation film formed from a metal oxide material of a region operating as a capacitive element is suppressed, and during the manufacturing process it is possible to carry out sufficient $H_2$ diffusion to prevent additional damage to semiconductor elements, such as memory cell transistors. Specifically, by arranging the upper electrode 140 so as to be positioned in a central section separated from an edge defined by the capacitive insulation film 130 and the lower electrode 120, a region of the lower electrode 120 and the capacitive insulation film 130 operating as a capacitive element constitutes a region that is substantially the same as a region of the upper electrode 140, in respective regions, which means that even if $H_2$ infiltrates from a side surface where the protective film 160 is not provided it is unlikely that there will be any detrimental influence on the operation of the capacitive element.

However, with a semiconductor device of this embodiment, in cases where it is necessary to reliably prevent diffusion of $H_2O$ and $H_2$ from the side surface of the capacitor, it is possible to also provide a protective film on the side surface of the capacitor. However, in this type of situation, since the protective film for preventing $H_2$ diffusion to the side surface of the capacitor is also provided, it is also necessary to take into consideration diffusion of $H_2$ for preventing damage to the semiconductor elements, and also, since side surface parts of the capacitor are connected to the protective film and the capacitor material the selection conditions for the protective film material must take into consideration reactivity of the upper electrode 140 and the capacitive insulating film 130, compared to the structure provided with the protective film on only the upper surface.

Figure 2A:
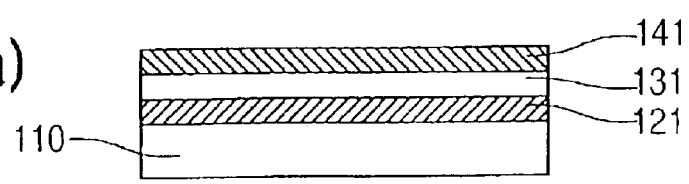
FIG. 2 is a cross sectional drawing showing respective processes of a method of manufacturing the semiconductor device of a first embodiment of the present invention.

Next, the structure of a semiconductor device of a first embodiment will be described with reference to the drawings. FIG. 2(a)–FIG. (f) are cross sectional drawings showing respective processes of a method of manufacturing the semiconductor device of the first embodiment. In FIG. 2, the same reference numerals are used for the same items in FIG. 1.

First of all, as shown in FIG. 2(a), Pt as a first conductive film 121 is film formed to a thickness of 150 nm on a semiconductor substrate 110 made up of memory cell transistors and peripheral transistors, being semiconductor elements constituting, for example, a semiconductor storage device, using a known sputtering method. After that, coating is performed on the first conductive film 121 using a known spin coating method, followed by drying and calcination to form a calcinated thin film. Next, crystallization of the calcinated thin film is performed by heat treatment at 800° C. in an oxygen atmosphere, for example, and an SBT film 131, being a insulating film made of a metal oxide material, is formed to about 200 nm. Pt is then film formed to a film thickness of 100 nm as a second conductive film 131 on the SBT film 131, similarly to the first conductive film 121.

Figure 2B:
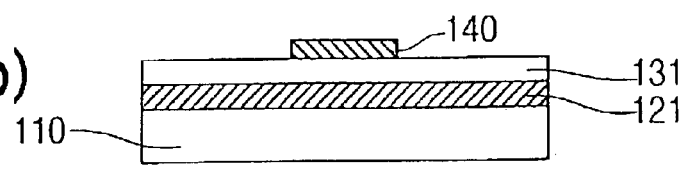

Next, after resist has been coated on the second conductive film 141, the Pt of the second conductive film 141 is processed by photolithography and a known etching process using the resist. In this way, as shown in FIG. 2(b), the upper electrode 140 is formed.

Figure 2C:
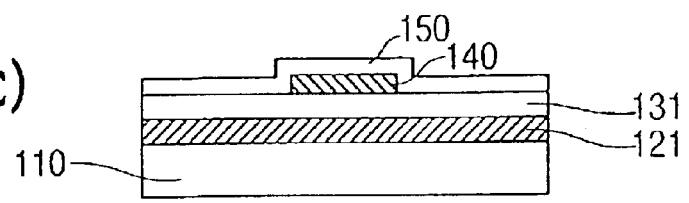

Following that, as shown in FIG. 2(c), a silicon oxide film 50 (hereinafter referred to as an ozone TEOS film) having ozone and Tetra-Ethyl-Ortho-Silicate as a main source material, is film formed to a thickness of approximately 10 nm on upper surfaces of the upper electrode 140 and the STB film 131 by a chemical vapor phase deposition method in an ozone ($O_3$) atmosphere (hereinafter referred to as CVD in an ozone atmosphere). Here, the ozone TEOS film has film thickness sufficient to prevent mutual reaction between the protective film formed subsequently and the material constituting the capacitor. Also, with this embodiment, the reason the ozone TEOS film is used as the silicon oxide film formed on the upper surface of the capacitor will first be described in the following.

A large amount of $H_2O$ is contained inside the silicon oxide film formed by plasma CVD under an ozone atmosphere, and in the case where it is provided directly connected to the capacitor material there is a danger of $H_2O$ of the silicon oxide film diffusing into the capacitor material due to heat treatment processing etc. in subsequent processing. In the manufacturing method of this embodiment, annealing is carried out after formation of the ozone TEOS film 150, in order to allow $H_2O$ contained inside the film to be released.

The annealing at this time is carried out in an oxygen atmosphere at a temperature of around 700° C. for about 30 minutes. It is important that the heat treatment here is carried out at a temperature that will cause the $H_2O$ to be released from within the ozone TEOS film. In this heat treatment, since H2 contained in microscopic amounts within the film is also released, it is possible to remove microscopic amounts of $H_2$ contained in the TEOS film. As a result, it becomes possible to reliably prevent film quality degradation of the capacitive insulating film due to heat treatment in subsequent processing steps.

Figure 3:
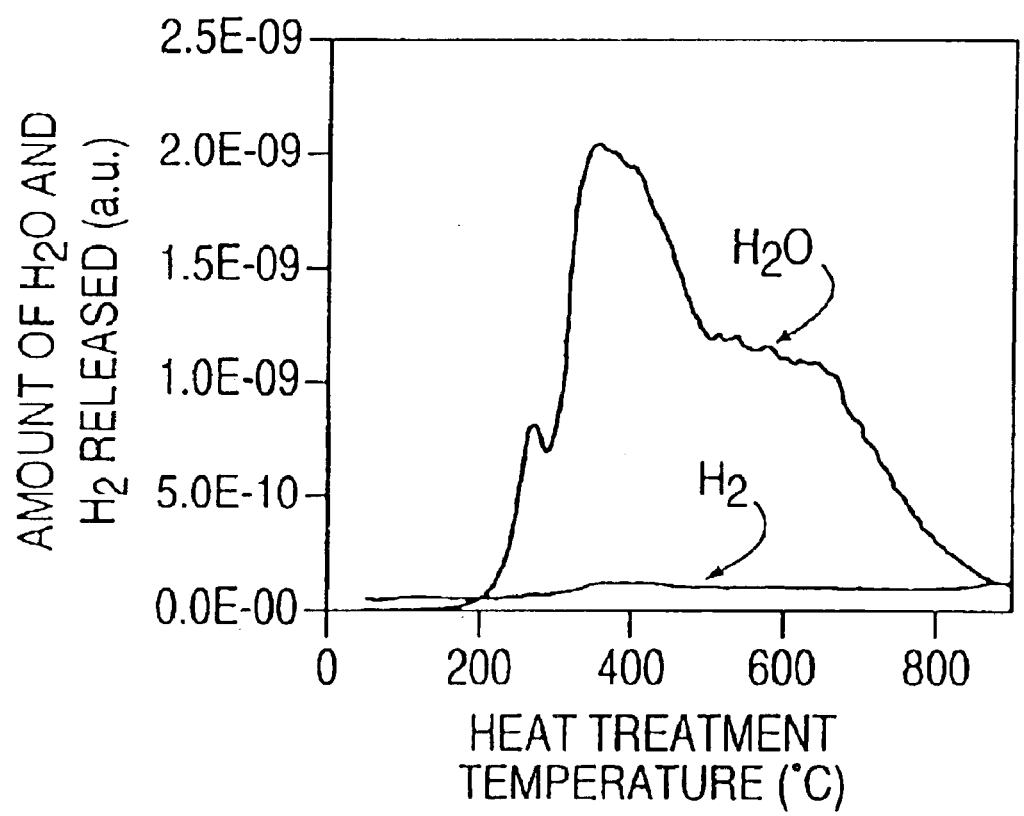
FIG. 3 is a drawing showing the relationship between heat treatment temperature of an ozone TEOS film, and the amount of $H_2O$ and $H_2$ released from the ozone TEOS film.

FIG. 3 is a drawing showing the relationship between heat treatment temperature and the amount of $H_2O$ and $H_2$ released from the ozone TEOS film. Specifically, as shown in FIG. 3, release of $H_2O$ from the ozone TEOS film begins at around 200° C., and at around 300° C. the amount of $H_2O$ released becomes maximum. Because of this, for the ozone TEOS film of this embodiment, it is preferable to carry out heat treatment for the release of $H_2O$ at a temperature of at least 300° C.

After this annealing, a protective film 160 for protecting the capacitor against $H_2$ diffused in subsequent manufacturing processes is formed on the ozone TEOS film 150 using a thin film of about 50 nm formed of, for example, Tantalum oxide ($Ta_2O_5$). These thin films are formed using a known sputtering method. Because there is a danger of the protective film 160 formed of $Ta_2O_5$ peeling off due to the film thickness becoming thick, it is preferable to optimize the film thickness according to the process.

Next, after formation of the protective film 160, a silicon oxide film 180 is formed, and this film constitutes a mask at the time of forming the capacitor. This silicon film 180 is formed by plasma CVD in an ozone atmosphere, or by normal plasma CVD. The silicon oxide film 180 is preferably used as a mask when forming the capacitor, and can also be formed from either from a single film comprising an ozone TEOS film or a silicon oxide film formed by plasma CVD, a lamination film comprising an ozone TEOS film and a silicon oxide film formed by plasma CVD, or a silicon nitride film formed by known CVD.

However, for similar reasons to the case of forming the ozone TEOS film 150 described previously, ozone CVD is preferably also used in formation of the silicon oxide film 180 of this embodiment provided in contact with the capacitor using an insulating film made of metal oxide material as a capacitive insulation film.

The film thickness of the silicon oxide film formed on the protective film 160 is set so as to enable use as an etching mask at the time of etching the laminated structure of the protective film 160, the ozone TEOS film 150, the SBT film 131 and the first conductive film 121. Specifically, the silicon oxide film is set so that upon completion of etching the laminated structure of the protective film 160, the ozone TEOS film 150, the SBT film 131 and the first conductive film 121, the silicon oxide film 180 remains on the protective film 160 to a thickness of about 100 nm.

Figure 2D:
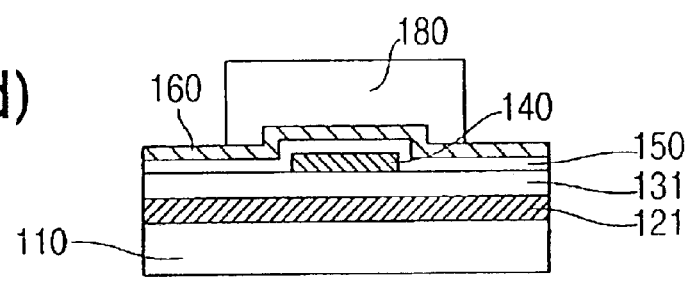

By doing this, after formation of the silicon oxide film on the protective film 160 the silicon oxide film is patterned by photolithography using resist and a known etching method, and an etching mask consisting of the silicon oxide film 180 is formed, as shown in FIG. 2(d).

Figure 2E:
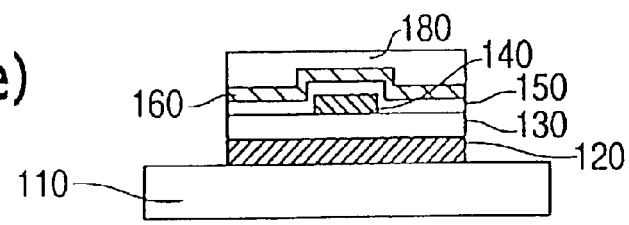

After that, as shown in FIG. 2(e), the laminated structure of the protective film 160, the ozone TEOS film 150, the SBT film 131 and the first conductive film 121 is etched with the patterned silicon oxide film 180 as a mask. In this way, a capacitor including the protective film 160 provided via the ozone TEOS film 150 and comprising the lower electrode 120, the capacitive insulation film 130 and the upper electrode 140 is formed. Here, the silicon oxide film 180 on the protective film 160 remains at a film thickness of 100 nm after being used as the etching mask.

At this time, in the event that the protective film 160 is formed of a material that can be etched under the same conditions as the etching conditions of the silicon oxide film 180 and the ozone TEOS film 150, such as $Ta_2O_5$, for example, it is possible to etch the protective film 160 and the ozone TEOS film 150 at the same time as etching to form the etching mask of the silicon oxide film 180. In this case, only the first conductive film 121 and the SBT film 131, that are difficult to process by etching using a chemical reaction for which an etching selection ratio can be determined in a straightforward manner, are not etched and remain. The first conductive film 121 and the SBT film 131 are processed by ion milling with the silicon oxide film 180 as an etching mask.

Here, milling processing involves ionization of heavy atoms such as argon (Ar), and etching in a fixed direction using kinetic energy of accelerated Ar ions. Etching utilizing this milling is different from etching utilizing chemical reaction, and it is difficult to determine a selection ratio.

For this reason, it is possible to shorten the etching time by making the thickness of the film to be etched thinner depending on the material of the protective film 160. As a result, it is also possible to shorten the over etching time, making it possible to suppress unnecessary damage to the semiconductor substrate 110 at the time of forming the lower electrode 120 and the capacitive insulation film 130.

Figure 2F:
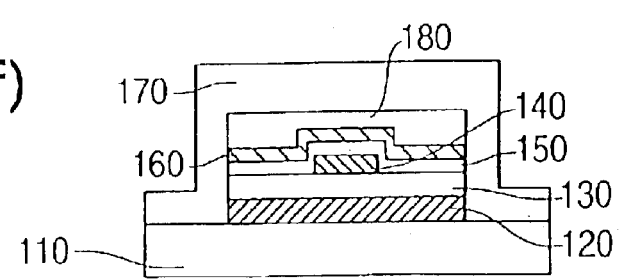

In addition, as shown in FIG. 2(f), after formation of the capacitor, an interlayer insulation film 170 is formed on the semiconductor substrate 110 including the capacitor by a known CVD method.

The interlayer insulation film 170 is formed from either from a single film comprising an ozone TEOS film or a silicon oxide film formed by normal plasma CVD, or a lamination film comprising an ozone TEOS film and a silicon oxide film formed by plasma CVD. At this time, the silicon oxide film 180 used as an etching mask for capacitor formation also functions as an interlayer insulation film.

The overall film thickness of the interlayer insulation film 170 is about 300 nm, for example, and if metallic wiring etc. is formed in subsequent processing steps the film thickness is preferably such as to have sufficient capacitance without short-circuiting between the capacitor and the metallic wiring.

Using these processes, a semiconductor device of this embodiment is obtained.

With the method of manufacturing the semiconductor device of this first embodiment, an ozone TEOS film 150 from which $H_2O$ has been removed in heat treatment after formation by plasma CVD in an ozone atmosphere is provided between the upper surfaces of the upper electrode 140 and the 130 and the capacitive insulation film 130 constituting the capacitor and the protective film 160, to a thickness of 10 nm. The silicon oxide film constituting the etching mask for processing the capacitor and the interlayer insulation film also adopts an ozone TEOS film.

In particular, with this embodiment since the silicon oxide film provided on the upper surface of the capacitor is formed by plasma CVD in an O3 atmosphere having strong oxidation film, it is possible to suppress the generation of $H_2$ at the time of forming the silicon oxide film, which means that in the case of application to a capacitor including an insulating film made of metal oxide material as a capacitive insulation film, mutual reaction between a protective film formed of thin silicon oxide film and the capacitor material is prevented, and it is possible to prevent film quality degradation of the capacitive insulation film due to the diffusion of $H_2$ at the time of forming the silicon oxide film.

With this embodiment, after formation of the ozone TEOS film, heat treatment is also carried out to remove $H_2O$ and $H_2$ included within the film. For this reason, even if various heat treatments are carried out in subsequent steps, because of the heat treated ozone TEOS film provided on the upper surface of the capacitor there is no diffusion of $H_2O$ or $H_2$ causing degradation in the film quality of the capacitive insulation film, which means that it is possible to prevent film quality degradation of the capacitive insulation film due to diffusion of $H_2$ after the film formation.

In this way, with this embodiment there is chemical stability between the capacitor material and the protective film for preventing diffusion of moisture formed by plasma CVD in an ozone atmosphere having low $H_2$ diffusion at the time of film formation, and a silicon oxide film of a material that does not easily react with the respective materials is provided between the capacitor and the protective film 160, making it possible to provide a capacitor that prevents mutual reaction between the protective film and the capacitor material.

Also, since it is not necessary to take into consideration the reactivity of the upper electrode 140 or the capacitive insulation film 130 in selection conditions for the material of the protective film 160, it is possible to appropriately select a material that forms an excellent barrier against diffusion of $H_2O$ and $H_2$. Accordingly, it becomes possible to sufficiently prevent degradation of film quality of the capacitive insulation film due to mutual reaction with $H_2O$ and $H_2$ generated during the manufacturing process, and as a result it becomes possible to provide a capacitor that maintains sufficient electrical characteristics.

With the semiconductor device of this embodiment, an example has been described where $Ta_2O_5$ is used as the protective film 160. However, as long as this protective film 160 is an insulating film having the effect of preventing diffusion of $H_2$, it is also possible to form a protective film 160 using another metal oxide material, for example, Titanium oxide ($TiO_2$), Aluminum oxide ($Al_3O_2$) or Tantalum Aluminum oxide ($Ta_xAl_yO_z$) which is a mixed crystal of Tantalum Oxide and Aluminum oxide, or a metal nitride film such as silicon nitride ($Si_3N_4$) or silicon nitrate (SiON).

Figure 4:
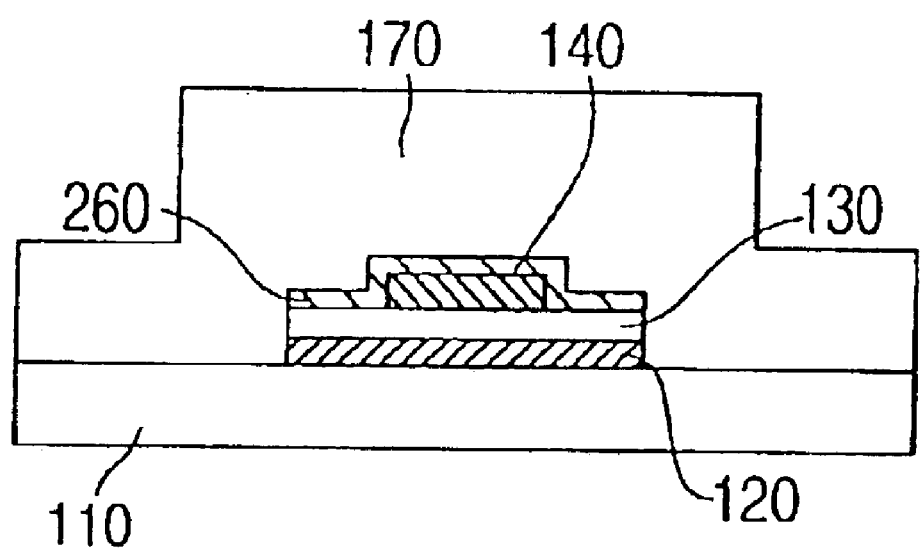
FIG. 4 is a cross sectional drawing showing a semiconductor device of a second embodiment of the present invention.

Next, a second embodiment of the present invention will be described with reference to the drawings FIG. 4 and FIG. 5 are drawings showing a second embodiment of the present invention, FIG. 4 being a cross sectional drawing of a semiconductor device of this embodiment, and FIGS. 5(a)–(f) being cross sectional drawings showing respective processes of a manufacturing method for the semiconductor device of this embodiment. In FIG. 4 and FIG. 5, the same reference numerals are used for parts that are the same as in the first embodiment.

With the semiconductor device of this second embodiment, the difference from the above described first embodiment is that the protective film is provided so as to directly cover the upper surface of the capacitor, namely the upper surface of the upper electrode and the capacitive insulation film, has an element constituting a crystallized core of at least the capacitive insulation film, and is formed from a metal oxide material having a compositional ratio of an element constituting a crystallized core lower than a compositional ratio of an element constituting a crystallized core contained inside the capacitive insulation film.

As shown in FIG. 4, with the semiconductor device of the second embodiment, similarly to the first embodiment, a lower electrode 120, a capacitive insulation film 130 and an upper electrode 140 are sequentially deposited on a semiconductor substrate 110 made up of semiconductor elements memory cell transistors and peripheral transistors constituting a semiconductor storage device.

With this embodiment also, the upper electrode 140 constituting the capacitor is made smaller than the capacitive insulation film 130 and the lower electrode formed underneath, and is arranged so as to be positioned at a central section separated from an edge defined by the capacitive insulation film 130 and the lower electrode 120.

In this embodiment also, similarly to the case of the first embodiment, bismuth strontium titanate ($SrBi_2Ta_2O_9$) (hereafter referred to as SBT), being one type of insulating film made from precious metal or a metallic compounds, is used as the lower electrode, and upper electrode constituting the capacitor, and the capacitive insulating film 130.

Further, with this embodiment a protective film 260 formed from an insulating film sharing elements comprising crystallized cores of at least the capacitive insulation film of the capacitor, and having a lower compositional ratio of elements comprised of crystallized core than the compositional ratio of crystallized cores contained within the capacitive insulation film, is formed to a film thickness of about 50 nm by a known spin coating method on the upper surface of the upper electrode 120 and capacitive insulating film 140 constituting this capacitor. The surface of the capacitor of this embodiment is covered by this protective film 260.

As the protective film 260 in this embodiment, it is possible to use an insulating film that is conventionally used as a protective film for preventing diffusion of $H_2$, has elements comprised of crystallized cores of at least the capacitive film of the capacitor, and has a lower compositional ratio of elements comprised of crystallized cores than insulation films such as $SrBi_2Ta_2O_9$, $Bi_1Ta_1O_4$, $SrBi_2O_4$ or $SrBi_2O_6$, for example $Sr_{1+x}Bi_{2-x}Ta_2O_9$ (0<x<2), $Bi_xTa_yO_z$ (0<x<1) or $Sr_xBiyOZ$ (0<y<2).

Specifically, in this embodiment using an SBT film as the protective film, bismuth (Bi) constitutes the elements comprised of crystallized cores. Also, in the case of using a PZT film formed from zirconium lead titanate (Pb(Zr, Ti)O3) as the capacitive insulating film, lead (Pb) forms the elements comprised of crystallized cores, and specifically an insulating film formed from $(Pb_x(Zr_{1-x}, Ti_y)O_3)$ or the like is used as the protective film.

An interlayer insulation film 170 giving electrical insulation between upper wiring layers etc. is then formed on the protective film 260 to a thickness of about 300 nm using a silicon oxide film.

With this embodiment, an insulating film having the same structural elements as in the capacitive insulation film of the capacitor or a metal oxide material containing a core element for crystallization of at least the capacitive insulation film, and having a lower compositional ratio of an element that becomes a crystallized core at the time of crystallization compared to that within the capacitive insulation film, is used in the protective film 260 provided in direct contact with the upper surface of the capacitor. The reason for this is that since the capacitive insulation film 130 and the protective film 260 have substantially the same structural elements, they are in a chemically stable state, and in particular, it is possible to suppress mutual reaction between the capacitive insulation film 130 and the protective film 260. Accordingly, degradation of film quality due to mutual reaction of the capacitive insulation film, which is one of the main factors causing degradation of electrical characteristics of a capacitor, is prevented.

Also with this embodiment using, an insulating film formed from metal oxide material with a compositional ratio of elements comprising crystallized cores that is lower than the compositional ratio of elements comprised of crystallized cores of the capacitive insulation film 130 us used as the protective film 260 for preventing $H_2$ diffusion.

In the case of using insulating films having different compositional ratios of elements comprising crystallized cores as the protective film and the capacitive insulation film, the crystallinity of the protective film having a low compositional ratio of elements comprised of crystallized cores will degrade compared to the crystallinity of the capacitive insulation film 130.

As a result, the protective film 260 formed from an insulating film having a low compositional ratio of elements comprising crystallized cores is not crystallized by heat treatment for crystallization carried out at the time of forming the capacitive insulation film 130 or by heat treatment for preventing damage to the capacitive insulation film 130 carried out after capacitor formation. That is, the protective film 260 becomes an amorphous film or a film containing microscopic crystals within the amorphous material. This means that even if the protective film 260 has been formed from an insulating film comprised of the same elements as the capacitive insulation film 130 the protective film 260 itself does not function as another capacitor insulation film, and it is possible to use an insulation film formed from the same structural elements as the capacitive insulation film as the protective film 260 for preventing diffusion of $H_2$.

Also, a barrier effect of the protective film 260 against diffusion of $H_2$ is much better in the case of using a film that has been made amorphous or that contains microscopic crystals as the protective film, compared to the case of using a film that has been completely crystallized as the protective film. This is not formed in the case where a grain boundary formed in the crystallized insulating film is an amorphous film or a film containing microscopic crystals within the amorphous material, and as a result it is possible to control diffusion of $H_2$ advancing along the grain boundary.

Based on the above described facts, in this embodiment an insulating film formed from a metal oxide material where x=0.5 is preferably used as the protective film.

In addition, with this embodiment, when it is necessary to more reliably control mutual reactivity between the capacitive insulation film 130, being the capacitor material, and the protective film 260, it is preferable in this second embodiment, similarly to the first embodiment, to have a structure where an ozone TEOS film that is chemically stable with respect to the capacitor material and the protective film provided between the upper surface of the capacitor and the protective film. However, in this case since there is a large amount of $H_2O$ within the ozone TEOS film provided on the upper surface of the capacitor, similarly to the first embodiment it is preferable to provide an ozone TEOS film from which $H_2O$ has been removed as much as possible by heat treatment.

This second embodiment also has a structure with the protective film 260 provided only on the upper surface of the capacitor. However, in this second embodiment also it is possible to provide the protective film 260 on suitable side surfaces of the capacitor.

In this way, with this second embodiment the structure is such that a protective film 260 formed from an insulating film sharing elements comprising crystallized cores of at least the capacitive insulation film of the capacitor, and having a lower compositional ratio of elements comprised of crystallized core than the compositional ratio of elements comprising crystallized cores contained within the capacitive insulation film, is provided so as to make direct contact on the upper surface of the capacitor. With a semiconductor device of this embodiment, by having this structure it is possible to prevent mutual reaction between the protective film and the capacitor material. Also with this embodiment, since it is possible to use an amorphous film or a film having crystals within the amorphous material as the protective film 260 having a high barrier effect, there is no degradation of film quality of the capacitive insulation film due to mutual reaction or $H_2O$ and $H_2$ generated during manufacturing processes, and as a result it becomes possible to provide a capacitor that maintains sufficient electrical characteristics.

Next, a method of manufacturing the semiconductor device of the second embodiment will be described with reference to the drawings. The semiconductor device of a first embodiment is manufactured using substantially the same steps as in the manufacturing method for the semiconductor device of the first embodiment that has been described.

FIG. 5(a)–FIG. 5(f) are cross sectional drawings showing respective processes of a method of manufacturing the semiconductor device of the second embodiment. In FIG. 5 also, the same reference numerals are used for the same parts as in the first embodiment.

Figure 5A:
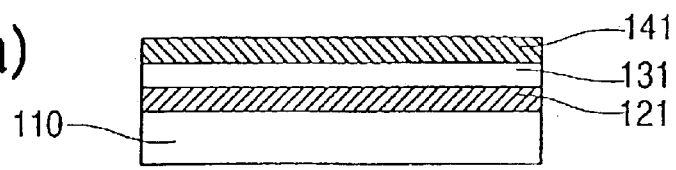
FIG. 5 is a cross sectional drawing showing respective processes of a method of manufacturing the semiconductor device of a second embodiment of the present invention.

With the semiconductor device of this embodiment, as shown in FIG. 5(a), first of all Pt is film formed to a thickness of 150 nm using a known sputtering method as a first conductive film 121 on a semiconductor substrate 110 made up of memory cell transistors of semiconductor active elements and peripheral transistors constituting, for example, as semiconductor storage device. After that, coating is performed on the first conductive film 121 using a known spin coating method, following by drying and calcination to form a calcinated thin film. Next, crystallization of the calcinated thin film is performed by heat treatment at 800° C. in an oxygen atmosphere, for example, and an SBT film 131, being a insulating film made of a metal oxide material, is formed to about 200 nm. Then, similarly to the first conductive film 121, a Pt film is formed to a thickness of 100 nm as a second conductive film 141 on an SBT film 131 made of bismuth strontium titanate ($SrBi_2Ta_2O_9$), using a known sputtering method.

Figure 5B:
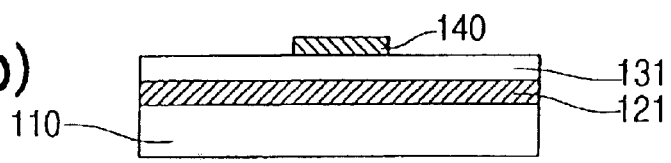

Next, after coating resist on the second conductive film 141, the Pt of the second conductive film 141 is processed by photolithography and a known dry etching method using the resist. In this way the upper electrode 140 is formed, as shown in FIG. 5(b).

Figure 5C:
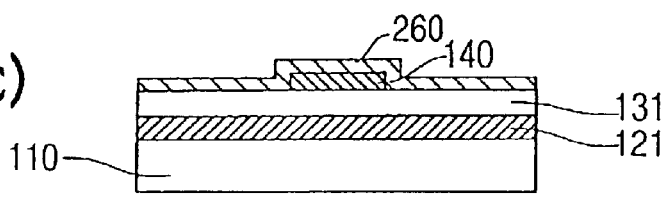

After that, as shown in FIG. 5(c), a protective film 260, formed from an insulating film that shares elements comprised of crystallized cores of at least the capacitive film of the capacitor, and having a lower compositional ratio of elements comprised of crystallized cores than the compositional ratio of elements comprising crystallized cores contained within the capacitive insulation film, such as, for example, $Sr_{1+x}Bi_{2-x}Ta_2O_9$ (0<x<2), $Bi_1Ta_yO_x$ (0<x<1), or $Sr_xBi_yO_z$ (0<y<2), is formed to a thickness of about 50 nm on the upper electrode 140 and the SBT film 131. In this way, the surface of the capacitor is covered by the protective film 260.

A method of manufacturing this protective film 260 will now be described. First, a protective material, such as, $Sr_{1+x}Bi_{2-x}Ta_2O_9$ (0<x<2), $Bi_xTa_yO_z$ (0<x<1), or $Sr_xBi_yO_z$ (0<y<2), for example, dissolved in an organic solvent, is coated on the semiconductor substrate 110 by a known spin coating method. The film thickness is adjusted so as to become a thickness, for example around 50 nm, that functions as a protective film to prevent diffusion of $H_2O$. Next, annealing to evaporate the organic solvent containing the protective material is carried out in an oxygen atmosphere at about 400° C. In this way, the protective film 260 is formed.

Also, after formation of the protective film 260 the protective film 260 is preferably made amorphous or subjected to heat treatment to form microscopic crystals within the amorphous material. The material used in this embodiment is preferably made amorphous in an oxygen atmosphere at a temperature of from 700–750° C., or subjected to heat treatment to form microscopic crystals within the amorphous material. With this embodiment, since the protective film is formed of an insulating film whose crystallinity has been degraded compared to the capacitive insulation film, this heat treatment can also serve as heat treatment for preventing damage to the capacitive insulation film after capacitor formation.

Using this type of heat treatment process, it becomes possible to use an insulation film having a high barrier effect with respect to $H_2$, such as an amorphous film or a film containing microscopic crystals within the amorphous material, as the protective film. As a result, it becomes possible to provide a semiconductor device that can further suppress film quality degradation of the capacitive insulation film.

Next, after formation of the protective film 260, a silicon oxide film 180 constituting a mask at the time of forming the capacitor is formed.

Similarly to the case of the first embodiment, this silicon oxide film 180 is formed by plasma CVD under an ozone atmosphere or normal plasma CVD. This silicon oxide film 180 is preferably used as a mask when forming the capacitor, and can also be formed from either from a single film comprising an ozone TEOS film or a silicon oxide film formed by plasma CVD, a lamination film comprising an ozone TEOS film and a silicon oxide film formed by plasma CVD, or a silicon nitride film formed by known CVD.

In this embodiment also, for the same reason as using an ozone TEOS film as the silicon oxide film 180 in the first embodiment, the silicon oxide film 180 constituting the etching mask for forming the capacitor is preferably formed using ozone CVD.

The film thickness of the silicon oxide film formed on the protective film 260 is set so that it can be used as an etching mask at the time of etching in a process of laminating the protective film 260, the SBT film 131 and the first conductive film 121. Specifically, the film thickness is set such that upon completion of etching in the process of laminating the protective film 260, the ozone TEOS film 150, the SBT film 131 and the first conductive film 121, the silicon oxide film 180 remains on the protective film 260 to a thickness of about 100 nm.

Figure 5D:
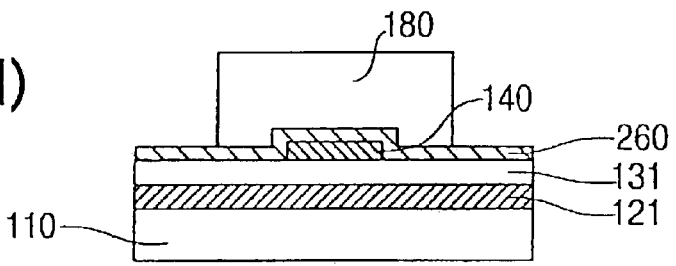

By doing this, after formation of the silicon oxide film on the protective film 260, the silicon oxide film is patterned by photolithography using resist and a known etching method, and an etching mask consisting of the silicon oxide film 180 is formed, as shown in FIG. 5(d).

At this time, in the event that the protective film 260 is formed of a material that can be etched under the same conditions as the etching conditions of the silicon oxide film 180, such as $Ta_2O_5$, for example, it is possible to etch the protective film 260 at the same time as etching to form the etching mask of the silicon oxide film 180. For this reason, similarly to the case of the first embodiment, by making a film thickness to be etched by ion milling thin, it is possible to shorten the etching time. As a result, it is also possible to shorten the over etching time, making it possible to suppress unnecessary damage to the semiconductor substrate 110 at the time of forming the lower electrode 120 and the capacitive insulation film 130.

Figure 5E:
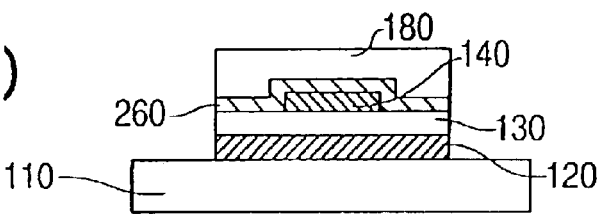

After that, as shown in FIG. 5(e), the laminated structure of the protective film 260, the SBT film 131 and the first conductive film 121 is etched with the patterned silicon oxide film 180 as a mask. In this way, a capacitor protected by the protective film 260 and comprising the lower electrode 120, the capacitive insulation film 130 and the upper electrode 140 is formed.

Here, the silicon oxide film 180 on the protective film 260 remains at a film thickness of 100 nm after being used as the etching mask.

Figure 5F:
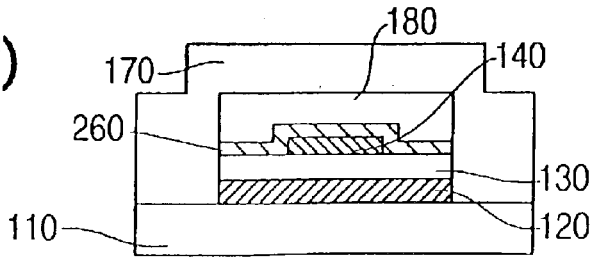

In addition, as shown in FIG. 5(f), after formation of the capacitor, an interlayer insulation film 170 is formed on the semiconductor substrate 110 including the capacitor by a known CVD method.

The interlayer insulation film 170 is formed from either from a single film comprising an ozone TEOS film or a silicon oxide film formed by normal plasma CVD, or a lamination film comprising an ozone TEOS film and a silicon oxide film formed by plasma CVD. At this time, the silicon oxide film 180 used as an etching mask for capacitor formation also functions as an interlayer insulation film.

The overall film thickness of the interlayer insulation film 170 is about 300 nm, for example, and if metallic wiring etc. is formed in subsequent processing steps the film thickness is preferably such as to have sufficient capacitance without causing a short-circuit between the capacitor and the metallic wiring.

Using these processes, a semiconductor device of the second embodiment is obtained.

With the manufacturing method for the semiconductor device of this second embodiment, an insulation film having the same structural elements as in the capacitive insulation film of the capacitor, or formed from a metal oxide material containing elements comprised of at least crystallized cores of the capacitive insulation film and having a low compositional ratio of elements comprised of crystallized core compared to that within the capacitive insulation film, is used as the protective film, and can be provided in direct contact with the upper surface of the upper electrode and capacitive insulation film of the capacitor. For this reason, in addition to the effects of the method of manufacturing the semiconductor device of the first embodiment, it is no longer necessary to form an ozone TEOS film for suppressing mutual reaction between the respective materials between the capacitor and the protective film. As a result, it is possible to provide a semiconductor device with fewer processes and in a shorter time compared to the first embodiment, that is capable of suppressing mutual reaction between the capacitor material and the protective film, and prevents degradation of electrical characteristics of the capacitor.

Also with this embodiment, it becomes possible to combine heat treatment for making the protective film amorphous or forming microscopic crystals within the amorphous material, to improve the barrier effects with respect to $H_2$ diffusion of the protective film, with heat treatment for preventing capacitor damage, making it possible to improve the barrier effect of the protective film without increasing the number of special heat treatment processes. As a result, it is possible to adopt a protective film with a high barrier effect with respect to $H_2$, while preventing mutual reaction, making it possible to provide a semiconductor device that more effectively prevents degradation of capacitor characteristics.

Figure 6A:
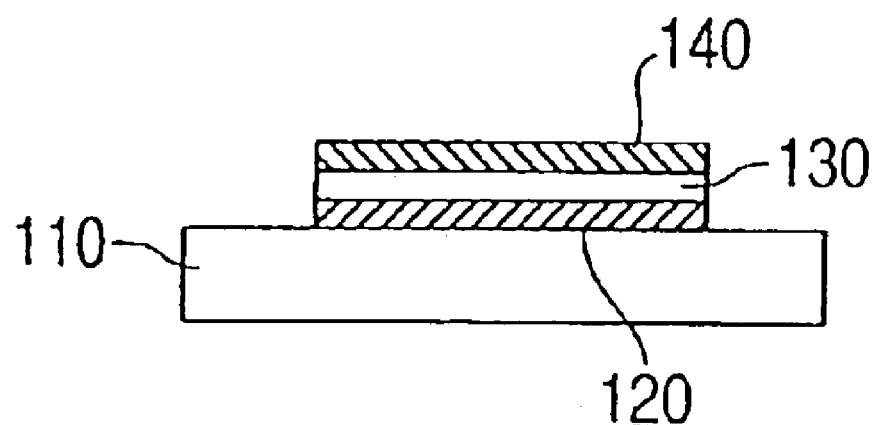
FIG. 6 is a cross sectional drawing showing different states of the capacitor of the present invention.
Figure 6B:
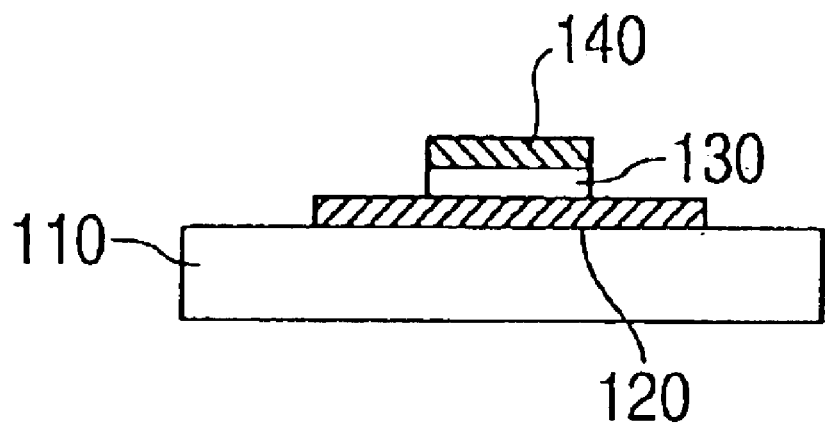

The semiconductor device of the present invention has been described in detail above, but the relationship between the upper electrode the capacitive insulation film and the lower electrode constituting the capacitor is not limited to the relationship described. As shown in FIG. 6(a) and FIG. 6(b), it is possible to have a relationship where the upper electrode the capacitive insulation film and the lower electrode are substantially equal, or where the upper electrode and the capacitive insulation film are substantially equal, or where the lower electrode is larger than the upper electrode and the capacitive insulation film.

Also, one example has been given of the materials for the lower electrode and the upper electrode, and the capacitive insulation film, in the above described embodiments, but obviously the present invention is not limited to these materials.

As has been described above, with the present invention there is chemical stability between the capacitor material and the protective film for preventing diffusion of moisture, it is difficult for the respective materials to react with one another, and an ozone TEOS film 150 is provided between the capacitor and the protective film 160, which means that the protective film and the capacitor are no longer in direct contact with each other, and it becomes possible to provide a capacitor that prevents mutual reaction between the protective film and the capacitor material. Further, as selection conditions for the material of the protective film 160, since it is not necessary to take into consideration the reactivity of the upper electrode 140 and the capacitive insulation film 130, it is possible to appropriately select a material that forms an excellent barrier against diffusion of $H_2O$ and $H_2$. Accordingly, there is no degradation of film quality of the capacitive insulation film due to mutual reaction and $H_2O$ and $H_2$ generated during the manufacturing process, and it becomes possible to provide a capacitor that maintains sufficient electrical characteristics. As a result, it becomes possible to provide a semiconductor device that has high reliability, and a manufacturing method for such a semiconductor device.

Additionally, by using a protective film 260, formed from an insulating film sharing elements comprising crystallized cores of at least the capacitive insulation film of the capacitor, and having a lower compositional ratio of elements comprised of crystallized core than the compositional ratio of elements comprising crystallized cores contained within the capacitive insulation film, on the upper surface of the capacitor, it becomes possible to prevent mutual reaction between the protective film and the capacitor material, and to prevent degradation in film quality of the capacitive insulation film due to $H_2O$ and $H_2$ generated in manufacturing processes after capacitor formation. Also with this embodiment, since it is possible to use a film having a comparatively high barrier effect, such as an amorphous film or a film having crystals within the amorphous material, as the protective film 260, it is possible to further suppress degradation in film quality of the capacitive insulation film due to $H_2O$ and $H_2$ generated during subsequent manufacturing processes. As a result, it becomes possible to provide a capacitor that maintains sufficient electrical characteristics, making it possible to provide a semiconductor that has higher reliability, and a method of manufacturing such a semiconductor device.

What is claimed is:

1. A method of manufacturing a semiconductor device, the method comprising:
   providing a substrate;
   forming capacitive elements over the substrate, wherein each of the capacitive elements includes a lower electrode, a metal oxide capacitive insulation film, and an upper electrode;
   depositing a first silicon oxide film having a prescribed thickness over a surface of the substrate including the capacitive elements by a chemical vapor deposition method using a gas containing ozone;
   carrying out heat treatment on the first silicon oxide film after formation of the first silicon oxide film;
   forming a protective film over the first silicon oxide film that has been subjected to heat treatment and covering an upper surface of the capacitive elements; and
   forming an insulation film over the protective film, wherein the insulation film has a thickness that is greater than the thickness of the first silicon oxide film.

2. A method as recited in claim 1, wherein the first silicon oxide film is formed with a chemical vapor deposition method using gas containing ozone and an organic silicon compound.

3. A method as recited in claim 1, wherein the protective film is a film having a hydrogen diffusion prevention effect.

4. A method as recited in claim 1, wherein the heat treatment step is carried out at a temperature of a least 300° C.

5. A method as recited in claim 1, further comprising forming another insulation film that is finer than the first silicon oxide film, before the forming of the protective film.

6. A method as recited in claim 1, wherein the forming of the protective film is a chemical vapor deposition method using gas containing ozone.

7. A method of manufacturing a semiconductor device, the method comprising:

sequentially forming a first conductive film, a metal oxide capacitive insulation film, and a second conductive film, over a surface of a substrate;

depositing a first silicon oxide film by a chemical vapor deposition method using gas containing ozone over the surface of the substrate, which includes the first conductive film, the metal oxide capacitive insulation film and the second conductive film;

carrying out heat treatment on the first silicon oxide film after formation of the first silicon oxide film;

patterning the first silicon oxide film that has been subjected to heat treatment;

carrying out etching with the patterned first silicon oxide film as a mask, and forming capacitive elements comprised of the first conductive film, the metal oxide capacitive insulation film and the second conductive film, over the surface of the substrate;

forming a protective film, after formation of the capacitive elements, to cover upper surfaces of the remaining first silicon oxide film and the capacitive elements; and forming an insulation film over the protective film, the insulation film being thicker than a thickness of the first silicon oxide film.

8. A method as recited in claim 7, wherein the depositing of the first silicon oxide film is carried out using a chemical vapor deposition method using gas containing ozone and an organic silicon compound.

9. A method as recited in claim 7, wherein the protective film is a film which inhibits hydrogen diffusion.

10. A method as recited in claim 7, wherein the heat treatment step is carried out at a temperature of at least 300° C.

11. A method as recited in claim 7, further comprising forming another insulation film that is finer than the first silicon oxide film, before the forming of the protective film.

12. A method as recited in claim 7, wherein the forming of the insulation film is a chemical vapor deposition method using gas containing ozone.

13. A method of manufacturing a semiconductor device, the method comprising:

providing a substrate;

forming a first conductive film, a metal oxide capacitive insulation film, and a second conductive film, over a surface of the substrate;

forming a first silicon oxide film over the surface of the substrate using a chemical vapor deposition method using gas containing ozone;

carrying out heat treatment on the first silicon oxide film after formation of the first silicon oxide film;

forming a protective film over the heat treated first silicon oxide film;

patterning the first conductive film, the metal oxide capacitive insulation film, the second conductive film, the first silicon oxide film and the protective film, to form a forming capacitive element over the surface of the substrate; and forming an insulation film having a thickness that is greater than a thickness of the first silicon oxide film on the protective film.

14. A method as recited in claim 13, wherein the first silicon oxide film is formed with a chemical vapor deposition method using gas containing ozone and an organic silicon compound.

15. A method as recited in claim 13, wherein the protective film is a film having a hydrogen diffusion prevention effect.

16. A method as recited in claim 13, wherein the heat treatment step is carried out at a temperature of at least 300° C.

17. A method as recited in claim 13, further comprising, before forming the protective film, forming another insulation film that is finer than the first silicon oxide film over the first silicon oxide film.

18. A method as recited in claim 13, further comprising, before the step of forming the insulation film, forming a second silicon oxide film on the protective film, using a chemical phase deposition method using gas containing ozone, and wherein the step of carrying out patterning of the first conductive film, the metal oxide capacitive insulation film, the second conductive film, the first silicon oxide film and the protective film is carried out using the second silicon oxide film which is patterned as a mask.

19. A method of manufacturing a semiconductor device, the method comprising:

sequentially laminating a lower electrode, a capacitive insulation film formed of a metal oxide, and an upper electrode, on a surface of a substrate to form capacitive elements; and forming a protective film over a surface of the substrate containing the capacitive elements, wherein the protective film is formed from a metal oxide material having elements composed of crystallized cores of at least the capacitive insulation film and having a compositional ratio of crystallized cores that is lower than a compositional ratio of crystallized cores contained within the capacitive insulation film.

20. A method as recited in claim 19, further comprising a step of carrying out heat treatment for the protective film and after formation of the protective film, wherein the heat treatment changes the protective film to an amorphous film or a film containing microscopic crystals.

21. A method as recited in claim 20, wherein the heat treatment step is heat treatment for restoring characteristics of the capacitive elements.

22. A method as recited in claim 19, further comprising a step of carrying out heat treatment at a temperature of from approximately 700° C. to approximately 750° C. after formation of the protective film, and wherein the capacitive insulation film is made from bismuth strontium titanate, and the protective film is made from any of $Sr_{1+x}Bi_{2-x}Ta_2O9$ (0<x<2).

23. A method as recited in claim 22, wherein the heat treatment step restores characteristics of the capacitive elements.

* * * * *